(12) United States Patent
Nagaya et al.

(10) Patent No.: US 12,288,720 B2
(45) Date of Patent: Apr. 29, 2025

(54) SEMICONDUCTOR CHIP, PROCESSED WAFER, AND METHOD FOR MANUFACTURING SEMICONDUCTOR CHIP

(71) Applicants: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

(72) Inventors: Masatake Nagaya, Nisshin (JP); Daisuke Kawaguchi, Hamamatsu (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K, Hamamatsu (JP)

( * ) Notice: Subject to any disclaimer, the term of this patent is extended or adjusted under 35 U.S.C. 154(b) by 247 days.

(21) Appl. No.: 17/680,464

(22) Filed: Feb. 25, 2022

(65) Prior Publication Data

US 2022/0285219 A1    Sep. 8, 2022

(30) Foreign Application Priority Data

Mar. 5, 2021    (JP) .................................. 2021-035558

(51) Int. Cl.
*H01L 21/78*    (2006.01)
*H01L 21/26*    (2006.01)
(Continued)

(52) U.S. Cl.
CPC .......... *H01L 21/7813* (2013.01); *H01L 21/26* (2013.01); *H01L 23/544* (2013.01);
(Continued)

(58) Field of Classification Search
CPC ... H01L 21/7813; H01L 21/26; H01L 21/784; H01L 23/544; H01L 33/0075; H01L 33/0093; H01L 33/0095
See application file for complete search history.

(56) References Cited

U.S. PATENT DOCUMENTS

2002/0096994 A1*  7/2002  Iwafuchi ............. H01L 21/6835
                                                         257/E27.111
2006/0270075 A1   11/2006  Leem
(Continued)

FOREIGN PATENT DOCUMENTS

JP    H03-248523 A    11/1991
JP    H05-234836 A    9/1993
(Continued)

OTHER PUBLICATIONS

Voronenkov et al., "Laser slicing: A thin film lift-off method for GaN-on-GaN technology", Results in Physics, 13, 102233, 2019 (Year: 2019).*

(Continued)

*Primary Examiner* — Jay C Kim
*Assistant Examiner* — Woo K Lee
(74) *Attorney, Agent, or Firm* — Posz Law Group, PLC

(57) ABSTRACT

A manufacturing method for a semiconductor chip includes: preparing a GaN wafer; producing a processed wafer by forming an epitaxial film on a surface of the GaN wafer to have chip formation regions adjacent to a first surface of the processed wafer; forming a first surface-side element component of a semiconductor element in each chip formation region; forming a wafer transformation layer along a planar direction of the processed wafer by irradiating an inside of the processed wafer with a laser beam; dividing the processed wafer at the wafer transformation layer into a chip formation wafer and a recycle wafer; extracting a semiconductor chip from the chip formation wafer; and after the
(Continued)

preparing the GaN wafer and before the dividing the processed wafer, irradiating an inside of the gallium nitride wafer or the processed wafer with a laser beam to form a mark by deposition of gallium.

13 Claims, 6 Drawing Sheets

(51) Int. Cl.
  *H01L 21/784* (2006.01)
  *H01L 23/544* (2006.01)
  *H01L 29/66* (2006.01)
  *H01L 33/00* (2010.01)
  *H10D 30/01* (2025.01)
  *H10D 89/00* (2025.01)
  *H10H 20/01* (2025.01)

(52) U.S. Cl.
  CPC . *H10D 89/013* (2025.01); *H01L 2223/54433* (2013.01); *H10D 30/015* (2025.01); *H10H 20/01* (2025.01); *H10H 20/0137* (2025.01); *H10H 20/018* (2025.01)

(56) References Cited

U.S. PATENT DOCUMENTS

2017/0263808 A1\* 9/2017 Hyun .................. H01L 33/0095
2021/0327757 A1   10/2021 Nagaya et al.

FOREIGN PATENT DOCUMENTS

| JP | 2003-209032 A | 7/2003 |
| JP | 2014-128914 A | 7/2014 |
| JP | 2015-119087 A | 6/2015 |

OTHER PUBLICATIONS

Voronenkov et al. (âLaser slicing: A thin film lift-off method for GaN-on-GaN technologyâ, Results in Physics, 13, 102233, 2019) (Year: 2019).\*

\* cited by examiner

SEMICONDUCTOR CHIP, PROCESSED WAFER, AND METHOD FOR MANUFACTURING SEMICONDUCTOR CHIP

CROSS REFERENCE TO RELATED APPLICATION

The present application claims the benefit of priority from Japanese Patent Application No. 2021-035558 filed on Mar. 5, 2021. The entire disclosures of the above application are incorporated herein by reference.

TECHNICAL FIELD

The present disclosure relates to a semiconductor chip made of gallium nitride (hereinafter, also referred to as GaN), a processed wafer, and a method for manufacturing the semiconductor chip.

BACKGROUND

It has been known to produce a semiconductor chip using a GaN wafer. In a production of the semiconductor chip, an identification mark may be formed on the GaN wafer. For example, the mark may be formed by performing a process of forming a recess portion on a surface of the GaN wafer by a laser beam, and a process of polishing the surface of the GaN wafer so that the recess portion remains.

SUMMARY

The present disclosure describes a semiconductor chip, a processed wafer, and a method for manufacturing a semiconductor chip, which have an identification mark with suppression of a crack in a GaN wafer.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1A:
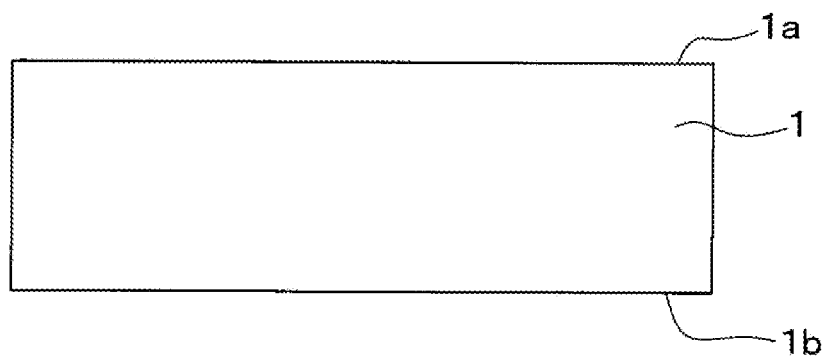
FIG. 1A is a cross-sectional view illustrating a manufacturing process of a semiconductor chip according to a first embodiment of the present disclosure.

In fact, a GaN wafer is very fragile. Therefore, if a recess portion is formed as an identification mark on the GaN wafer, there is a concern that a crack will occur in the GaN wafer from the recessed portion as a starting point of the crack.

The present disclosure provides a semiconductor chip, a processed wafer, and a method for manufacturing a semiconductor chip, which are capable of suppressing cracking while forming an identification mark.

According to an aspect of the present disclosure, a method relates to a method for manufacturing a semiconductor chip formed with a semiconductor element. The method includes: preparing a gallium nitride wafer made of gallium nitride; producing a processed wafer by forming an epitaxial film on a surface of the gallium nitride wafer, in which the processed wafer has a first surface on the epitaxial film side and a second surface on the gallium nitride wafer side, and the processed wafer includes a plurality of chip formation regions adjacent to the first surface of the processed wafer; forming a first surface-side element component of the semiconductor element in each of the plurality of chip formation regions; forming a wafer transformation layer, in which nitride is separated from gallium, along a planar direction of the processed wafer by irradiating an inside of the processed wafer with a laser beam from the second surface side of the processed wafer; dividing the processed wafer at the wafer transformation layer as a boundary into a chip formation wafer including the first surface of the processed wafer and a recycle wafer including the second surface of the processed wafer; extracting a semiconductor chip from the chip formation wafer; and, after the preparing of the gallium nitride wafer and before the dividing of the processed wafer, forming a mark inside of one of the gallium nitride wafer and the processed wafer by irradiating an inside of the one with a laser beam, the mark being formed by a deposition of gallium.

In such a method, the mark is provided by the gallium deposited inside the processed wafer, and a recess portion as a mark is not formed on the processed wafer. Therefore, it is possible to suppress the processed wafer from cracking starting from the mark.

According to an aspect of the present disclosure, a processed wafer includes a semiconductor chip formed with a semiconductor element. The processed wafer includes a gallium nitride wafer, an epitaxial film disposed on a surface of the gallium nitride wafer, and a mark disposed inside of at least one of the gallium nitride wafer and the epitaxial film, the mark being provided by a gallium deposition.

In such a configuration, the mark is provided by the gallium deposited inside the processed wafer, and a recess portion as a mark is not formed on the processed wafer. Therefore, it is possible to suppress the processed wafer from cracking starting from the mark.

According to an aspect of the present disclosure, a semiconductor chip includes: a chip constituent substrate that is made of gallium nitride, has a first surface and a second surface opposite to the first surface, and includes a semiconductor element; and a mark disposed inside the chip constituent substrate, the mark being a gallium deposition.

In such a configuration, the mark is provided by the gallium deposited inside of the processed wafer, and a recess portion is not formed on the processed wafer. Therefore, it is possible to suppress the semiconductor chip from cracking starting from the mark.

Hereinafter, embodiments of the present disclosure will be described with reference to the drawings. In the embodiments described hereinafter, the same or equivalent parts are designated by the same reference numerals.

First Embodiment

A first embodiment will be described with reference to the drawings. Hereinafter, a method for manufacturing a semiconductor chip 100 in which a semiconductor element is formed on a chip constituent substrate 110 including GaN will be described.

First, as shown in FIG. 1A, a GaN wafer 1 in a bulk wafer shape is prepared. The GaN wafer 1 has a first surface 1a and a second surface 1b. For example, as the GaN wafer 1, a wafer doped with silicon, oxygen, germanium or the like and having an impurity concentration of $5 \times 10^{17}$ cm$^{-3}$ to $5 \times 10^{19}$ cm$^{-3}$ is used. The thickness of the GaN wafer 1 may be arbitrary. For example, a wafer having a thickness of about 400 μm is prepared, as the GaN wafer 1. In the GaN wafer 1 of the present embodiment, the first surface 1a is a Ga plane and the second surface 1b is an N plane. Further, the GaN wafer 1 is prepared by recycling a recycle wafer 40 of FIG. 1L, which will be described later, after the manufacturing process of the semiconductor chip 100 described below is performed.

The second surface 1b of the GaN wafer 1 is subjected to grinding or polishing as necessary, so that the second surface 1b has the surface roughness of 10 nm or less. As a result, when the laser beam L is applied to the second surface 1b side of the GaN wafer 1 as described later, it is less likely that the laser beam L will be diffusely reflected on the second surface 1b of the GaN wafer 1.

Figure 1B:
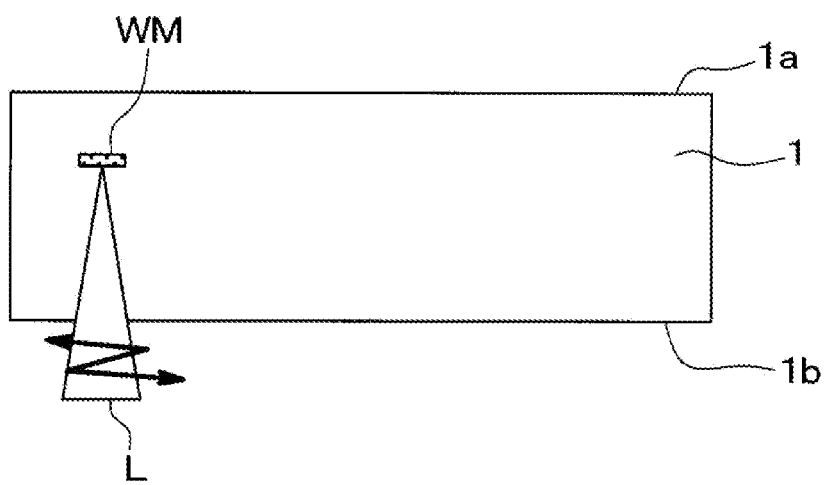
FIG. 1B is a cross-sectional view illustrating a manufacturing process of the semiconductor chip subsequent to FIG. 1A.

Next, as shown in FIG. 1B, the laser beam L is applied to the second surface 1b of the GaN wafer 1 so as to form a wafer mark WM, such as a lot number for an identification of the wafer 1, inside the GaN wafer 1. Specifically, a laser device having a laser light source, a dichroic mirror, a condensing lens, a displaceable stage and the like is prepared. The laser light source oscillates the laser beam L. The dichroic mirror is arranged so as to change the direction of an optical axis (that is, an optical path) of the laser beam L. The condensing lens (that is, a condensing optical system) is arranged to condense the laser beam L. When forming the wafer mark WM, the GaN wafer 1 is placed on the stage, and the position of the stage or the like is adjusted so that the condensing point of the laser beam L is set to a predetermined position inside the GaN wafer 1.

In the GaN wafer 1, gallium atom and nitrogen atom are separated by thermal energy. Nitrogen is evaporated as a gas while gallium is deposited. As a result, the wafer mark WM is formed by the deposition of the gallium. In the present embodiment, the position to form the wafer mark WM is adjusted so that the wafer mark WM is left on the recycle wafer 40 side after a processed wafer 10, which will be described later, is divided into a chip formation wafer 30 and the recycle wafer 40.

The wafer mark WM may have any identifiable shape or pattern, such as a line or a polygon, or a number. Although not particularly limited, a solid-state laser beam such as a green laser beam having a wavelength of 532 nm is used as the laser beam L to form the wafer mark WM in the present embodiment. The laser beam L is emitted so as to have a processing point output of 2 μJ, a pulse width of 500 ps, and a processing speed of 500 mm/s. However, these conditions are merely examples, and the present inventors have confirmed that the wafer mark can be appropriately formed even when the processing point output of the laser beam L is reduced or even when the pulse width is reduced. Further, the present inventors have confirmed that the wafer mark WM can be appropriately formed even when the processing point output of the laser beam L is increased or even when the pulse width is increased.

After the wafer mark WM is formed, the GaN wafer 1 is subjected to a heat treatment so as to promote the deposition of gallium and improve the visibility of the wafer mark WM. In this case, the heat treatment is performed on the GaN wafer 1 on which a semiconductor element is not formed. Therefore, the temperature of the heat treatment is equal to or higher than the melting point of gallium (that is, 29.76 degrees Celsius) and equal to or lower than 1000 degrees Celsius.

Figure 1C:
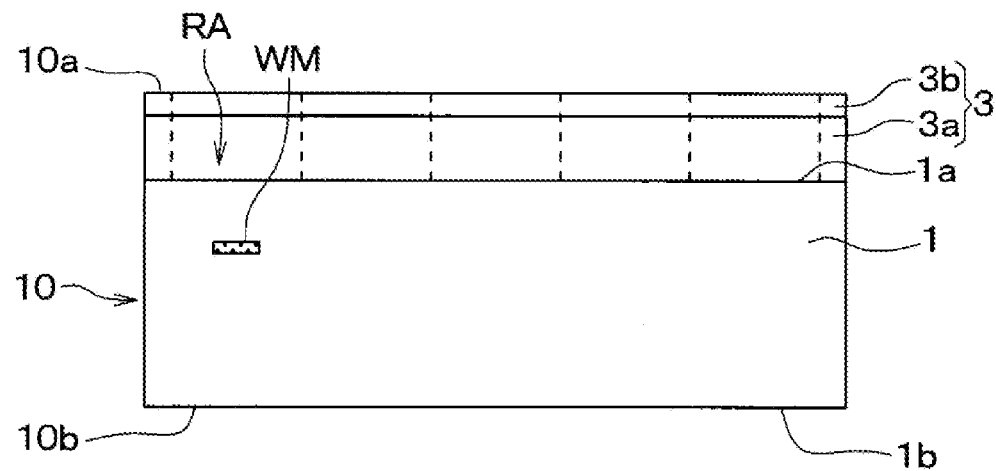
FIG. 1C is a cross-sectional view illustrating a manufacturing process of the semiconductor chip subsequent to FIG. 1B.

Next, as shown in FIG. 1C, a processed wafer 10 having a plurality of chip formation regions RA is prepared by forming an epitaxial film 3 on the first surface 1a of the GaN wafer 1. The epitaxial film 3 is made of GaN with a thickness of approximately 10 μm to 60 μm. In the present embodiment, the wafer mark WM has been formed inside the GaN wafer 1. Therefore, the processed wafer 10 is configured with the wafer mark WM formed inside.

In the present embodiment, the epitaxial film 3 is formed by depositing an n$^+$ type epitaxial layer 3a and an n$^-$ type epitaxial layer 3b in order on the GaN wafer 1. For example, the n$^+$ type epitaxial layer 3a is doped with silicon, oxygen, germanium, or the like, and has an impurity concentration of about $5 \times 10^{17}$ cm$^{-3}$ to $1 \times 10^{18}$ cm$^{-3}$. The n$^-$ type epitaxial layer 3b is doped with silicon or the like, and has an impurity concentration of about $1 \times 10^{17}$ cm$^{-3}$ to $4 \times 10^{17}$ cm$^{-3}$.

The n$^-$ type epitaxial layer 3b is a part in which a first surface-side element component 11 such as a diffusion layer 12, which will be described later, is formed. For example, the n$^-$ type epitaxial layer 3b has a thickness of about 8 μm to 10 μm. The n$^+$ type epitaxial layer 3a is a part for securing the thickness of the semiconductor chip 100, which will be described later. For example, the n$^+$ type epitaxial layer 3a has a thickness of about 40 μm to 50 μm. The thickness of the n$^+$ type epitaxial layer 3a and the thickness of the n$^-$ type epitaxial layer 3b may be arbitrary. In this case, for example, the n$^+$ type epitaxial layer 3a is thicker than the n$^-$ type epitaxial layer 3b so as to secure the thickness of the semiconductor chip 100. Hereinafter, a surface of the processed wafer 10 on the epitaxial film 3 side is referred to as a first surface 10a of the processed wafer 10, and a surface of the processed wafer 10 on the GaN wafer 1 side is referred to as a second surface 10b of the processed wafer 10. The chip formation regions RA are formed adjacent to the first surface 10a of the processed wafer 10.

Figure 1D:
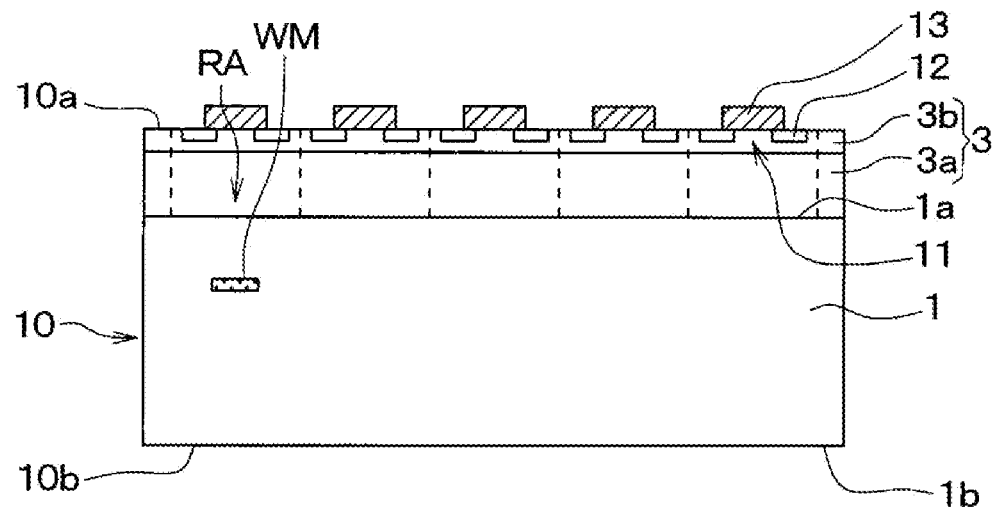
FIG. 1D is a cross-sectional view illustrating a manufacturing process of the semiconductor chip subsequent to FIG. 1C.

Next, as shown in FIG. 1D, a general semiconductor manufacturing process is performed. A process for forming the first surface-side element component 11 of the semiconductor element such as the diffusion layer 12, a gate electrode 13, a surface electrode (not shown), a wiring pattern (not shown) and a passivation film (not shown) is performed in each chip formation region RA. In this case, as the semiconductor element, devices having various configurations are adopted. Examples of the semiconductor element include a power device such as a high electron mobility transistor (HEMT) and an optical semiconductor element such as a light emitting diode. Thereafter, if necessary, a surface protection film made of a resist or the like is formed on the first surface 10a of the processed wafer 10.

Figure 1E:
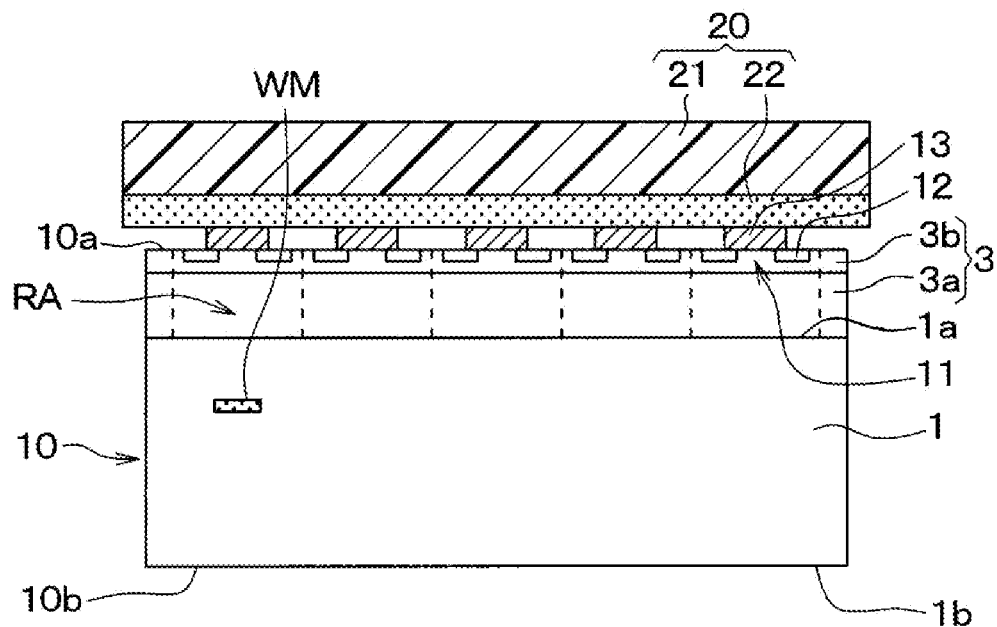
FIG. 1E is a cross-sectional view illustrating a manufacturing process of the semiconductor chip subsequent to FIG. 1D.

Subsequently, as shown in FIG. 1E, a holding member 20 is arranged on the processed wafer 10 adjacent to the first surface 10a of the processed wafer 10. As the holding member 20, for example, a dicing tape or the like having a base material 21 and an adhesive 22 is used. The base material 21 is made of a material that does not easily warp during the manufacturing process. For example, the base material 21 is made of glass, a silicon substrate, ceramics, or the like. The adhesive 22 is made of a material whose adhesive strength can be changed. For example, the adhesive 22 is made of an adhesive whose adhesive force changes depending on temperature or light. In this case, the adhesive 22 is made of, for example, an ultraviolet curable resin, wax, double-sided tape, or the like. Here, the adhesive 22 may be made of a material that maintains the adhesive force even when a second surface-side element component 60, which will be described later with reference to FIG. 1J, is formed.

Figure 1F:
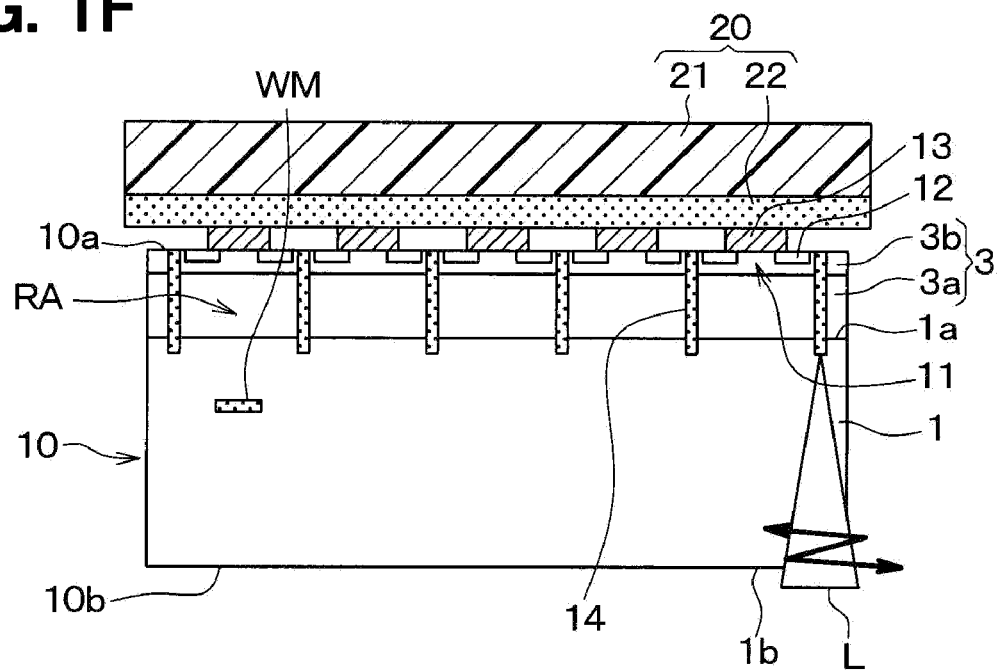
FIG. 1F is a cross-sectional view illustrating a manufacturing process of the semiconductor chip subsequent to FIG. 1E.

Next, as shown in FIG. 1F, the laser beam L is applied from the second surface 10b side of the processed wafer 10 to form a chip transformation layer 14 at a part corresponding to an outer edge including the boundary between the adjacent chip formation regions RA. Specifically, a laser device similar to the one used in the process of FIG. 1B is prepared. When forming the chip transformation layer 14, the processed wafer 10 is placed on the stage and the position of the stage or the like is adjusted so that the condensing point of the laser beam L is relatively scanned along the outer edge of each chip formation region RA.

As a result, on the outer edge of each chip formation region RA, the chip transformation layer 14 in which gallium and nitrogen are decomposed by thermal energy is formed. More specifically, by irradiating the processed wafer 10 with the laser beam L, the chip transformation layer 14 in which nitrogen is evaporated as a gas and gallium is deposited is formed. The chip transformation layer 14 is in a state of having fine pores therein as the nitrogen atom is separated and evaporated. Further, the chip transformation layer 14 is shared between the adjacent chip formation regions RA at the boundary between the adjacent chip formation regions RA. That is, at the part where the chip formation regions RA are adjacent, the chip transformation layer 14 is formed along the boundary of the adjacent chip formation region RA.

Further, in the present embodiment, when forming the chip transformation layer 14, the stage or the like is appropriately moved and the laser beam L is applied so that the condensing point moves at two or more locations different in the thickness direction of the processed wafer 10 at the outer edge of each of the chip formation regions RA. In this case, the chip transformation layers 14 are formed at different locations in the thickness direction of the processed wafer 10. However, the chip transformation layers 14 may be separated from each other or may be connected to each other. Further, when the condensing point is moved at two or more different locations in the thickness direction of the processed wafer 10, the condensing point is moved from first surface 10a side to the second surface 10b side of the processed wafer 10.

The chip transformation layer 14 is formed so as to allow nitrogen, which is generated by forming a wafer transformation layer 15, to discharge outside through the pores of the chip transformation layer 14, when the wafer transformation layer 15 shown in FIG. 1F is formed. Although not particularly limited, in the present embodiment, when forming the chip transformation layer 14, a solid-state laser beam such as a green color laser beam having a wavelength of 532 nm is used as the laser beam L. The laser beam L is emitted to have a processing point output of 2 µJ, a pulse width of 500 ps, and a processing speed of 500 mm/s. These conditions are merely examples, and the present inventors have confirmed that the chip transformation layer 14 can be appropriately formed even when the processing point output of the laser beam L is reduced or even when the pulse width is reduced. Further, the present inventors have confirmed that the chip transformation layer 14 can be appropriately formed even when the processing point output of the laser beam L is increased or even when the pulse width is increased.

Figure 1G:
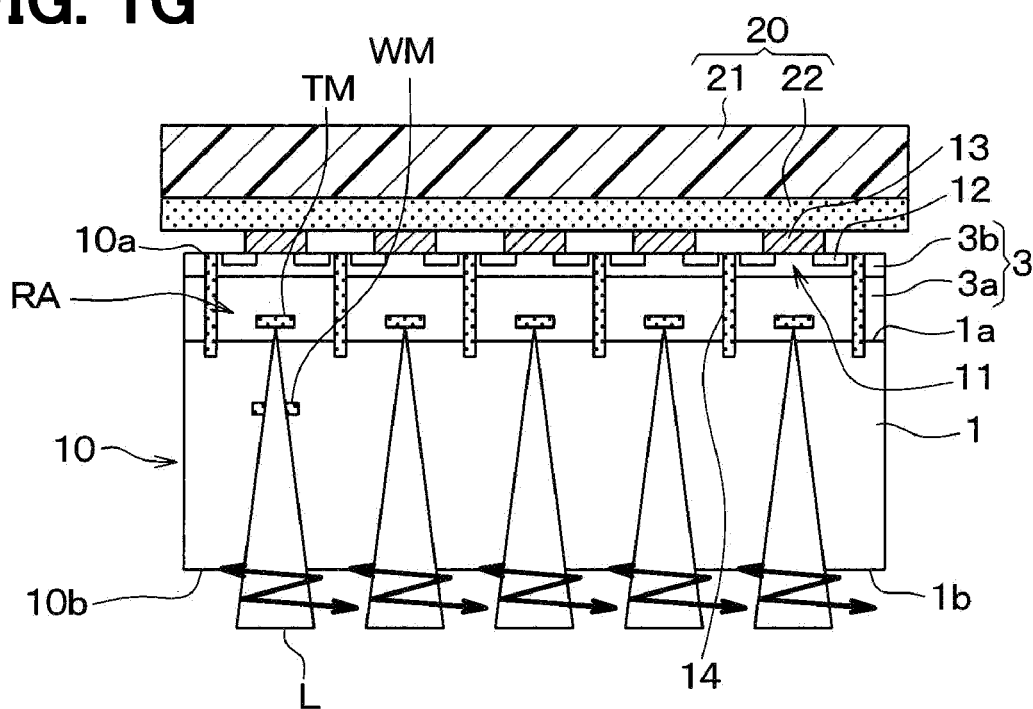
FIG. 1G is a cross-sectional view illustrating a manufacturing process of the semiconductor chip sequent to FIG. 1F.

Subsequently, as shown in FIG. 1G, the laser beam L is applied to the processed wafer 10 from the second surface 10b side of the processed wafer 10 to form a chip mark TM inside of each of the chip formation regions RA. The chip mark TM is, for example, a lot number for identification of the semiconductor chip 100 in the manufacturing of the semiconductor chip 100, which will be described later.

Specifically, a laser device similar to the one used in the process of FIG. 1B is prepared. Then, when forming the chip marks TM, the processed wafer 10 is placed on the stage, and the position of the stage or the like is adjusted so that the condensing point of the laser beam L is at a predetermined position of each chip formation region RA. The chip mark TM has various identifiable shape or pattern, such as a line or a polygon, or a number. Although not particularly limited, in the present embodiment, the conditions of the laser beam L for forming the chip mark TM is the same as those for forming the wafer mark WF.

Thereafter, a heat treatment is performed so as to promote the deposition of gallium and improve the visibility of the chip mark TM. Since the heat treatment here is performed onto the processed wafer 10 on which the first surface-side element component 11 has been formed, the temperature of the heat treatment is equal to or higher than the melting point of gallium (that is, 29.76 degrees Celsius) and is equal to or less than 200 degrees Celsius.

Figure 1H:
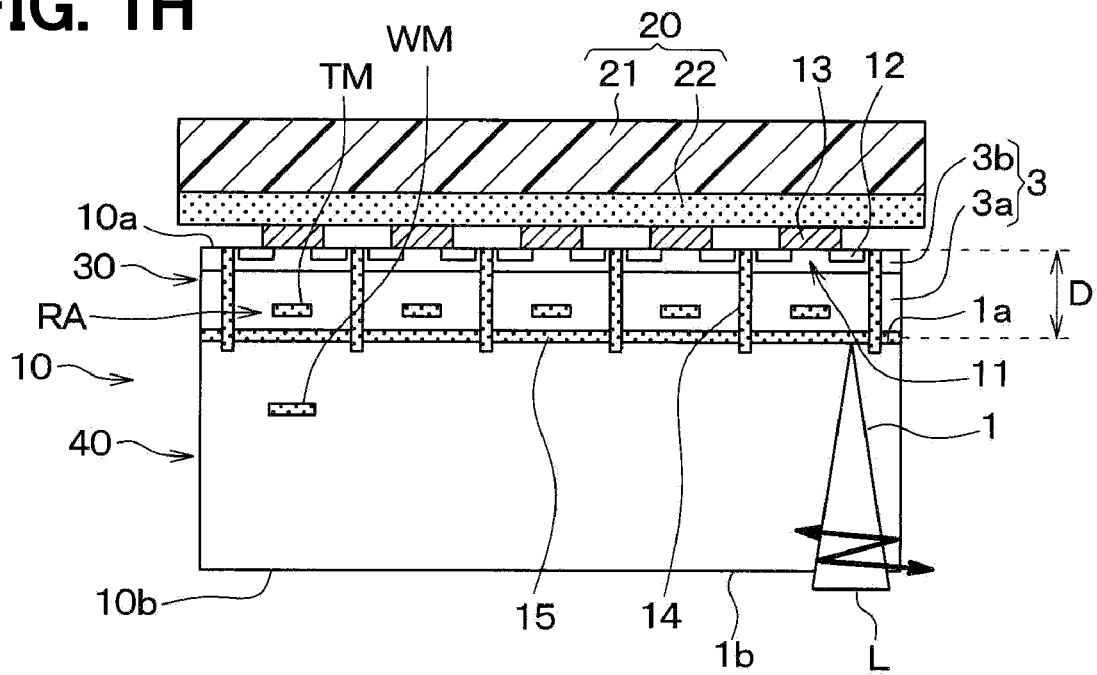
FIG. 1H is a cross-sectional view illustrating a manufacturing process of the semiconductor device subsequent to FIG. 1G.

Subsequently, as shown in FIG. 1H, the laser beam L is applied to the processed wafer 10 from the second surface 10b side of the processed wafer 10 so as to form the wafer transformation layer 15 along a planar direction of the processed wafer 10 at a predetermined depth D from the first surface 10a of the processed wafer 10. In the present embodiment, the wafer transformation layer 15 is formed by using the same laser device as the one used in the process of FIG. 1B.

When the wafer transformation layer 15 is formed, the position of the stage or the like is adjusted so that the condensing point of the laser beam L is relatively scanned in the planar direction of the processed wafer 10. As a result, the wafer transformation layer 15 is formed in the processed wafer 10 along the planar direction. The wafer transformation layer 15 has a configuration in which nitrogen has evaporated as a gas and gallium is deposited, similarly to the chip transformation layer 14.

In the present embodiment, the wafer transformation layer 15 is formed so as to intersect the chip transformation layers 14 or extends directly under the chip transformation layers 14. As a result, it is less likely that a large distortion will be applied to each of the chip formation regions RA when the wafer transformation layer 15 is formed.

Figure 2A:
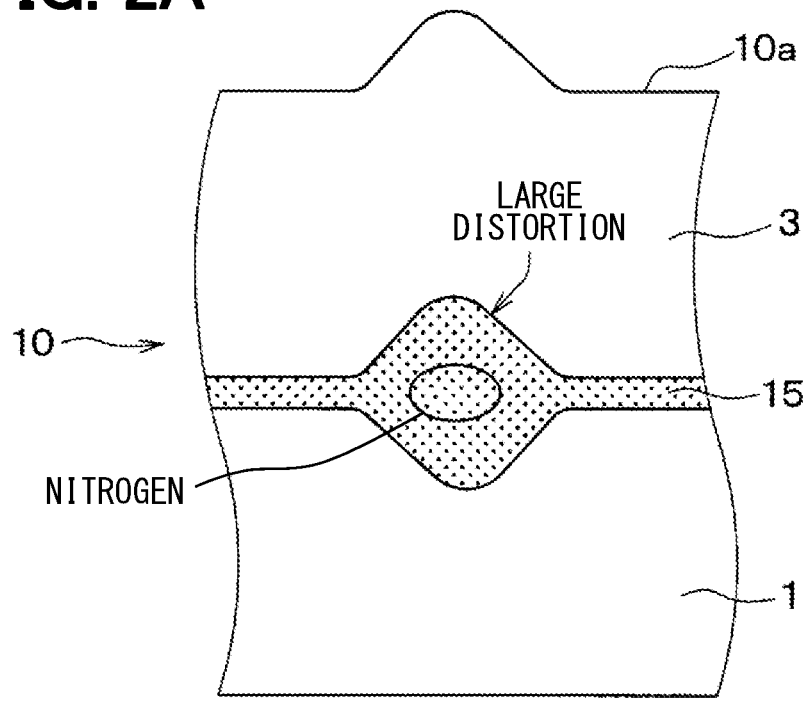
FIG. 2A is a schematic view of a configuration of a case where a wafer transformation layer is formed without forming a chip transformation layer.
Figure 2B:
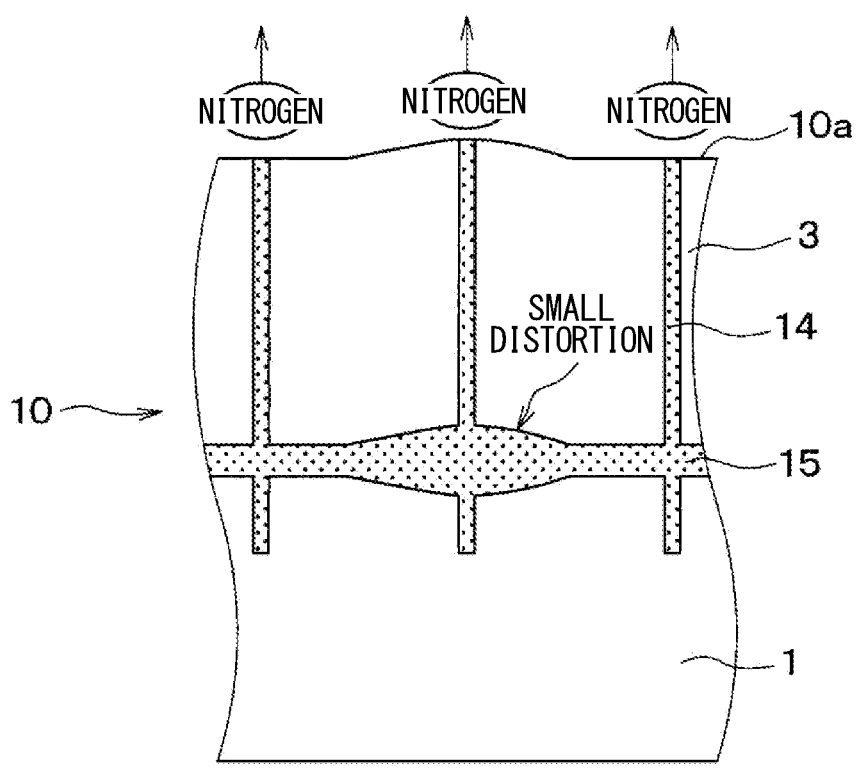
FIG. 2B is a schematic view of a configuration of a case where a wafer transformation layer is formed after the chip transformation layer is formed.

That is, in a case where the chip transformation layer 14 is not formed, as shown in FIG. 2A, the nitrogen generated when the wafer transformation layer 15 is formed is difficult to be released to the outside. Therefore, there is a possibility that the distortion of the processed wafer 10 due to the wafer transformation layer 15 being formed will be enlarged. In the present embodiment, on the other hand, the chip transformation layers 14 are formed, and the wafer transformation layer 15 is formed so as to intersect the chip transformation layers 14 or pass directly under the chip transformation layers 14. Therefore, as shown in FIG. 2B, nitrogen generated when the wafer transformation layer 15 is formed is easily released to the outside through the pores of the chip transformation layers 14. As such, it is possible to suppress an enlargement of the distortion of the processed wafer 10 due to the formation of the wafer transformation layer 15, and it is possible to suppress the distortion from being applied to each chip formation region RA.

Although not particularly limited, in the present embodiment, when forming the wafer transformation layer 15, a solid-state laser beam such as a green color laser beam having a wavelength of 532 nm is used as the laser beam L. The laser beam L is emitted to have a processing point output of 0.1 μJ to 0.3 μJ, a pulse width of 500 ps, and a processing speed of 50 mm/s to 500 mm/s. These conditions are merely examples, and the present inventors have confirmed that the wafer transformation layer 15 can be formed appropriately even when the processing point output of the laser beam L is reduced or even when the pulse width is reduced. Also, the present inventors have confirmed that the wafer transformation layer 15 can be formed appropriately even when the processing point output of the laser beam L is increased or even when the pulse width is increased.

Further, the predetermined depth D to form the wafer transformation layer 15 is set according to the ease of handling of the semiconductor chip 100, the withstand voltage, and the like. For example, the predetermined depth D is about 10 μm to 200 μm. In this case, the position of the wafer transformation layer 15 is changed according to the thickness of the epitaxial film 3. The wafer transformation layer 15 is formed at least inside of the epitaxial film 3, at the boundary between the epitaxial film 3 and the GaN wafer 1, or inside of the GaN wafer 1. FIG. 1H shows an example in which the wafer transformation layer 15 is formed at the boundary between the epitaxial film 3 and the GaN wafer 1.

It is to be noted that at least a part of the GaN wafer 1 in the processed wafer 10 is recycled as the recycle wafer 40, as described later. Therefore, the wafer transformation layer 15 may be preferably formed inside the epitaxial film 3 or at the boundary between the epitaxial film 3 and the GaN wafer 1. In a case where the wafer transformation layer 15 is formed inside the GaN wafer 1, the wafer transformation layer 15 is preferably formed adjacent to the first surface 1a of the GaN wafer 1.

In the case where the wafer transformation layer 15 is formed inside the epitaxial film 3, the wafer transformation layer 15 is formed inside the $n^+$ type epitaxial layer 3a instead of the inside of the $n^-$ type epitaxial layer 3b constituting the semiconductor element. Hereinafter, a part of the processed wafer 10 on the first surface 10a side from the wafer transformation layer 15 is referred to as a chip formation wafer 30, and a part of the processed wafer 10 on the second surface 10b side from the wafer transformation layer 15 is referred to as the recycle wafer 40.

Figure 1I:
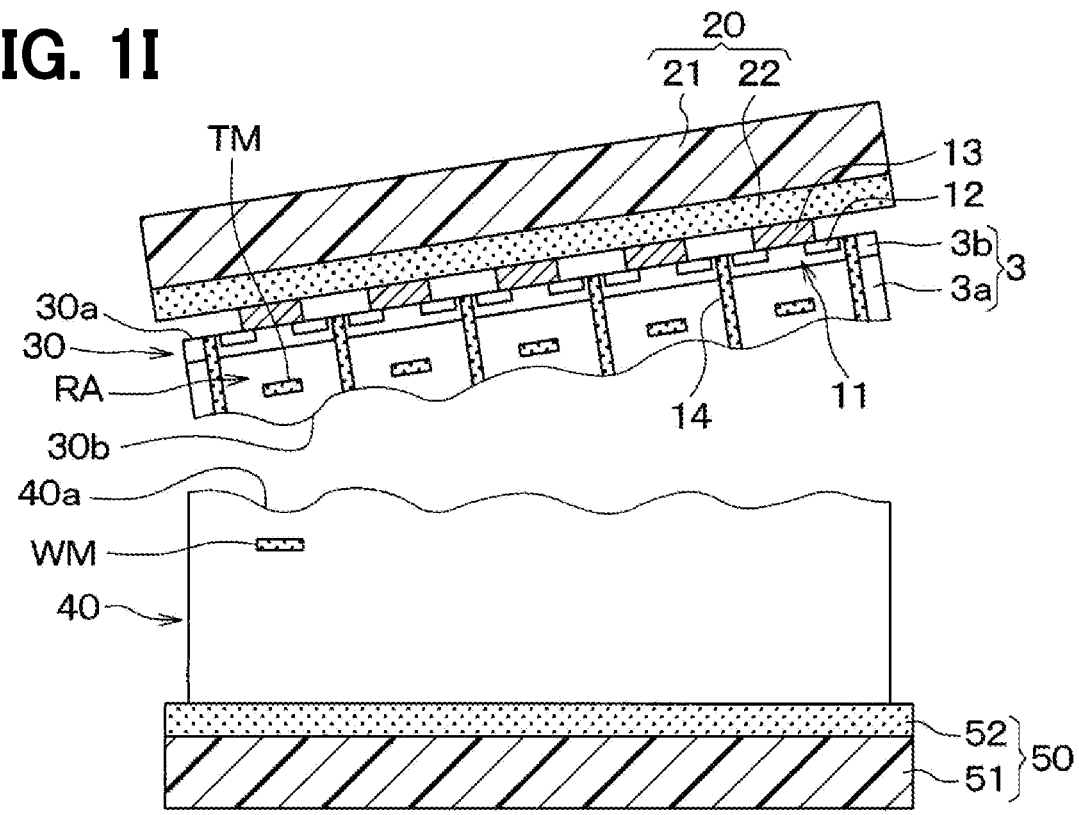
FIG. 1I is a cross-sectional view illustrating a manufacturing process of the semiconductor chip subsequent to FIG. 1H.
Figure 1J:
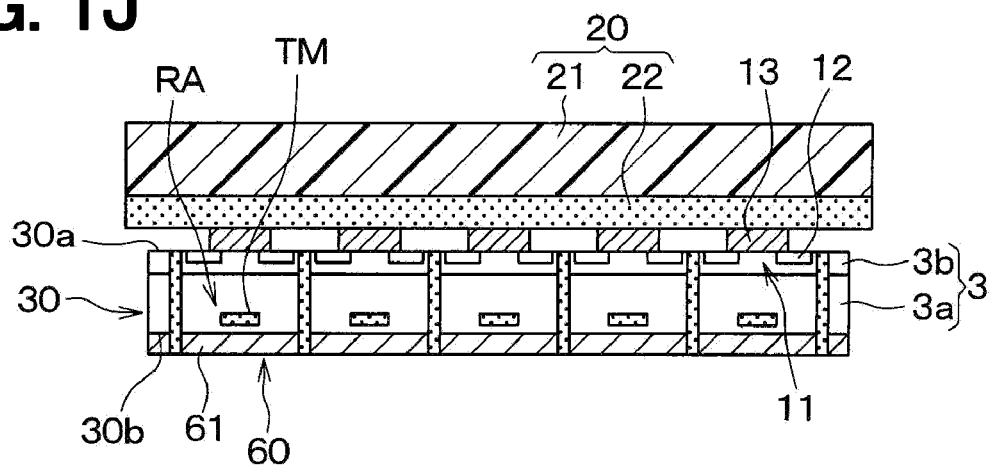
FIG. 1J is a cross-sectional view illustrating a manufacturing process of the semiconductor chip subsequent to FIG. 1I.

Next, as shown in FIG. 1I, an auxiliary member 50 is arranged on the second surface 10b side of the processed wafer 10. For example, the auxiliary member 50 includes a base material 51 and an adhesive 52 capable of changing the adhesive force, similarly to the holding member 20. In this case, the base material 51 of the auxiliary member 50 is made of, for example, glass, a silicon substrate, ceramics, or the like. Also, the adhesive 52 of the auxiliary member 50 is made of, for example, an ultraviolet curable resin, wax, double-sided tape, or the like. Then, the holding member 20 and the auxiliary member 50 are gripped and a tensile force or the like is applied in the thickness direction of the processed wafer 10, so that the processed wafer 10 is divided into the chip formation wafer 30 and the recycle wafer 40 at the wafer transformation layer 15 as a boundary (that is, the starting point of dividing).

As described above, the wafer mark WM is preferably formed so as to remain in the recycle wafer 40. As a result, when the recycle wafer 40 is used as the GaN wafer 1 as described later, the manufacturing process can be performed from or after the process shown in FIG. 10. Hereinafter, the surface of the chip formation wafer 30 on which the first surface-side element component 11 is formed will be referred to as a first surface 30a, and a divided surface of the chip formation wafer 30 will be referred to as a second surface 30b. Also, a divided surface of the recycle wafer 40 will be referred to as a first surface 40a. Further, in each of the drawing shown in FIG. 1I and subsequent figures, illustrations of the wafer transformation layer 15 and the like remaining on the second surface 30b of the chip formation wafer 30 and the first surface 40a of the recycle wafer 40 are appropriately omitted.

As shown in FIG. 1J, a general semiconductor manufacturing process is performed. A process for forming a second surface-side element component 60 of a semiconductor element such as a metal film 61 forming a back surface electrode on the second surface 30b of the chip formation wafer 30 will be performed.

Before the process of forming the second surface-side element component 60, a process of flattening the second surface 30b of the chip formation wafer 30 by a chemical mechanical polishing (CMP) technique or the like may be performed as necessary. FIG. 1J shows an example when the second surface 30b of the chip formation wafer 30 is flattened. Further, after performing the process of forming the second surface-side element component 60, a heat treatment such as a laser annealing or the like may be performed in order to make an ohmic contact between the metal film 61 and the second surface 30b of the chip formation wafer 30 as necessary.

Figure 1K:
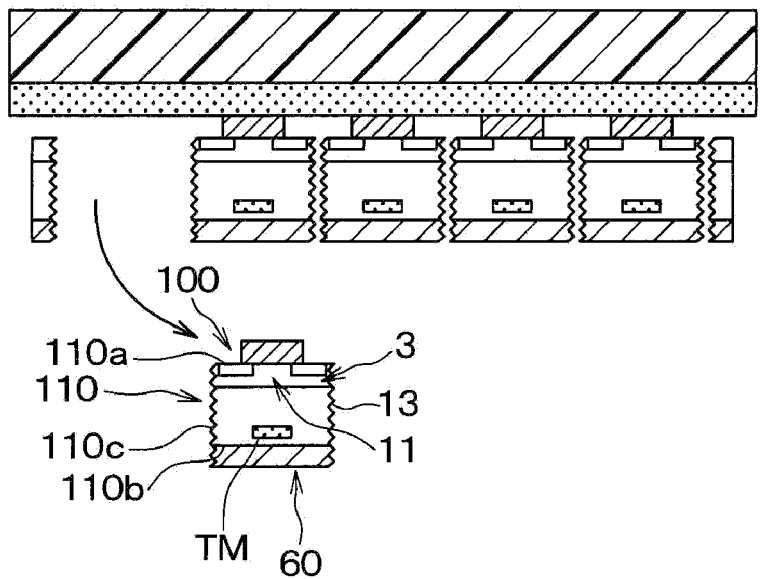
FIG. 1K is a cross-sectional view illustrating a manufacturing process of the semiconductor chip following FIG. 1J.

Subsequently, as shown in FIG. 1K, the holding member 20 is expanded, so that the chip formation regions RA are divided at the chip transformation layers 14 as the boundary (that is, the starting point of dividing). Thereafter, the adhesive force of the adhesive 22 is weakened by a heat treatment or irradiation with light, and the semiconductor chips 100 are picked up. In this way, the semiconductor chips 100 are manufactured. Before the chip formation wafer 30 is divided into the chip formation regions RA, if necessary, a slit or the like may be formed in the metal film 61 at the boundary between the chip formation regions RA so as to easily divide the metal film 61 for each chip formation region RA. In this case, in the process of FIG. 1J, a metal mask covering portions to be divided may be prepared, so that the metal film 61 is not formed on the portions to be divided.

The semiconductor chip 100 manufactured as described above includes the chip constituent substrate 110 having a first surface 110a, a second surface 110b on the opposite side to the first surface 110a, and a side surface 110c connecting the first surface 110a and the second surface 110b. The chip constituent substrate 110 has the epitaxial film 3 made of GaN. The chip constituent substrate 110 is formed with the first surface-side element component 11 on the first surface 110a side and the second surface-side element component 60 on the second surface 110b side. Further, the semiconductor chip 100 is provided with the chip mark TM formed as described above.

Since the semiconductor chip 100 of the present embodiment is configured by dividing the chip formation substrate 30 at the chip transformation layer 14 as a boundary, the chip transformation layer 14 remains on the side surface 110c. In this case, the chip transformation layer 14 is a layer in which gallium and nitrogen are separated and the gallium is deposited, and is in a state where minute irregularities are formed. Therefore, in the manufacturing method of the present embodiment, the semiconductor chip 100 that is easy to handle is manufactured.

Figure 1L:
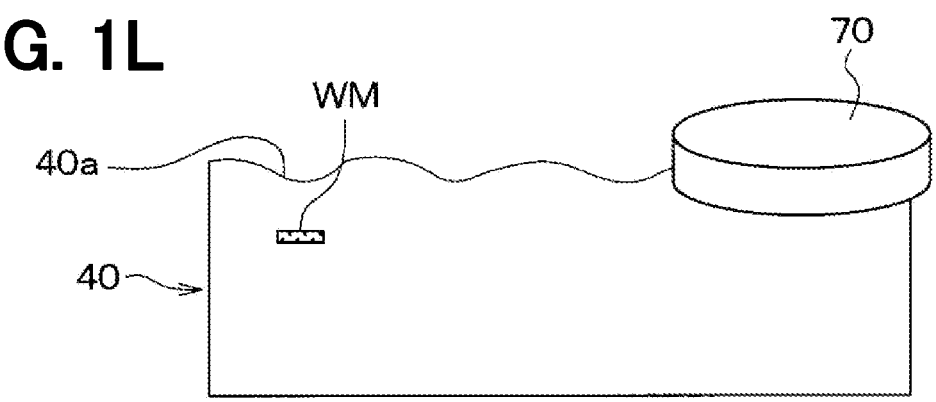
FIG. 1L is a cross-sectional view illustrating a manufacturing process of the semiconductor chip subsequent to FIG. 1K.

Further, as shown in FIG. 1L, the first surface 40a of the recycle wafer 40 formed by the process shown in FIG. 1I is flattened by the CMP technique using a polishing device 70 or the like. Then, the flattened recycle wafer 40 is used as the GaN wafer 1, and the process after FIG. 1A is performed again. As a result, the GaN wafer 1 can be used a plurality of times to form the semiconductor chips 100. Note that, in the case where the recycle wafer 40 is formed with the wafer mark WM, the process after FIG. 1O is performed without performing the process of FIG. 1B again.

According to the embodiment described above, gallium is deposited inside the processed wafer 10 to form the wafer mark WM. Thus, recessed portions are not formed on the first surface 10a and the second surface 10b of the processed wafer 10. As such, it is possible to suppress the processed wafer 10 from cracking starting from the wafer mark WM.

According to the embodiment described above, gallium is deposited inside the semiconductor chip 100 to form the chip mark TM. Thus, recessed portions are not formed on the first surface 110a and the second surface 110b of the chip constituent substrate 110 constituting the semiconductor chip 100. As such, it is possible to suppress the semiconductor chip 100 from cracking starting from the chip mark TM.

Further, since the wafer mark WM is formed inside the processed wafer WM, it is possible to suppress the generation of minute dust or the like when forming the wafer mark WM. Similarly, since the chip mark TM is formed inside the semiconductor chip 100, it is possible to suppress the generation of minute dust or the like when forming the chip mark TM. Accordingly, it is possible to prevent dust and the like from adhering to the processed wafer 10 and the semiconductor chip 100 when forming these marks WM and TM.

(1) In the present embodiment, the wafer mark WM is formed before the first surface-side element component 11 is formed. Therefore, the selection of conditions of the heat treatment and the like can be broadened as compared with the case where the wafer mark WM is formed after the first surface-side element component 11 is formed.

(2) In the present embodiment, the wafer mark WM is formed in the part that can be used as the recycle wafer 40. As a result, when the recycle wafer 40 is used again as the GaN wafer 1, it is not necessary to newly form the wafer mark WM, and thus the manufacturing process can be simplified.

(3) In the present embodiment, the chip mark TM is formed before the wafer transformation layer 15 is formed. Therefore, as compared with a case where the chip mark TM is formed after the wafer transformation layer 15 is formed, it is possible to suppress the laser beam L for forming the chip mark TM from being scattered by the wafer transformation layer 15. As a result, the chip mark TM can be favorably formed.

(4) In the present embodiment, the heat treatment is performed after the wafer mark WM is formed and after the chip mark TM is formed. Therefore, the deposition of gallium forming each of the wafer mark WM and the chip mark TM can be promoted, and the visibility of each of the wafer mark WM and the chip mark TM can be improved.

(5) In the present embodiment, the processed wafer 10 is divided into the chip formation wafer 30 and the recycle wafer 40, and the recycle wafer 40 is used again as the GaN wafer 1. Therefore, it is not necessary to newly prepare a GaN wafer 1 every time the semiconductor chips 100 are manufactured, and the GaN wafer 1 can be effectively used. As such, the productivity of the semiconductor chip 100 can be improved.

Other Embodiments

Although the present disclosure has been described in accordance with the embodiments, it is understood that the present disclosure is not limited to such embodiments or structures. The present disclosure encompasses various modifications and variations within the scope of equivalents. Furthermore, various combinations and aspects, and other combination and aspect including only one element, more than one element or less than one element, are also within the sprit and scope of the present disclosure.

For example, in the first embodiment described above, the epitaxial film 3 may be made of only the n⁻ type epitaxial layer 3b.

Further, in the first embodiment described above, in the process shown in FIG. 1J, the metal film 61 may be formed without polishing the second surface 30b of the chip formation wafer 30. For example, when an optical semiconductor element or the like is formed as the semiconductor element, a rough structure may be formed on the second surface 110b of the semiconductor chip 100. In this case, it is possible to effectively extract light from the second surface 110b side. Immediately after the processed wafer 10 is divided into the chip formation wafer 30 and the recycle wafer 40, the second surface 30b of the chip formation wafer 30 is in a state where the wafer transformation layer 15 remains, and has minute irregularities. Therefore, when forming the optical semiconductor element, the second surface 30b of the chip formation wafer 30 may not be polished, and the irregularities of the wafer transformation layer 15 may be used.

Further, in the first embodiment described above, in the process of forming the epitaxial film 3 shown in FIG. 1B, an epitaxial film may be also formed on the second surface 1b of the GaN wafer 1. In such a case, for example, even when the wafer transformation layer 15 is formed in the GaN wafer 1, it is easy to keep a thickness equal to or more than a predetermined thickness as the recycle wafer 40, and the number of times that the recycle wafer 40 is recycled can be increased.

In the first embodiment described above, only one of the process of forming the wafer mark WM and the process of forming the chip mark TM may be performed.

In the first embodiment described above, the process of forming the wafer mark WM may be performed after the process of forming the epitaxial film 3 shown in FIG. 1C and before the process of forming the first surface-side element component 11 shown in FIG. 1D. Further, the wafer mark WM may be formed in a part of the processed wafer 10 corresponding to the chip formation wafer 30.

In the first embodiment described above, the process of forming the chip mark TM may be performed after the process of forming the wafer transformation layer 15 shown in FIG. 1H.

In the first embodiment described above, instead of forming the chip transformation layer 14, a groove may be formed at a position corresponding to the chip transformation layer 14. In the first embodiment described above, after the chip formation wafer 30 is formed without forming the chip transformation layer 14 and the groove portion, the chip formation wafer 30 may be divided into chip units as the pieces of the semiconductor chips 100 by using a dicing saw, laser dicing, or the like.

What is claimed is:

1. A method for manufacturing a semiconductor chip formed with a semiconductor element, the method comprising:
   preparing a gallium nitride wafer made of gallium nitride;
   producing a processed wafer by forming an epitaxial film on a surface of the gallium nitride wafer, the processed wafer having a first surface on a side of the epitaxial film and a second surface on a side of the gallium nitride wafer, the processed wafer including a plurality of chip formation regions adjacent to the first surface of the processed wafer;
   forming a first surface-side element component of the semiconductor element in each of the plurality of chip formation regions;
   forming a wafer transformation layer, in which nitride is separated from gallium, along a horizontal direction of the processed wafer by irradiating an inside of the processed wafer with a laser beam from the second surface side of the processed wafer;
   dividing the processed wafer at the wafer transformation layer as a boundary into a chip formation wafer including the first surface of the processed wafer and a recycle wafer including the second surface of the processed wafer;
   extracting the semiconductor chip from the chip formation wafer; and
   after the preparing of the gallium nitride wafer and before the dividing of the processed wafer, forming a mark inside of one of the gallium nitride wafer and the processed wafer by irradiating an inside of the one with a laser beam, the mark being formed by a decomposition of the gallium nitride,
   wherein
   the forming the mark includes forming a wafer mark as the mark, after the preparing of the gallium nitride wafer and before the forming of the first surface-side element component.

2. The method according to claim 1, wherein
   in the forming of the wafer mark, the wafer mark is formed at a part included in the recycle wafer.

3. The method according to claim 1, wherein
   the forming of the mark includes forming a chip mark as the mark in each of the plurality of chip formation regions, after the forming of the first surface-side element component and before the forming of the wafer transformation layer.

4. The method according to claim 1, further comprising:
   performing a heat treatment after the forming of the mark.

5. The method according to claim 1, wherein
   the preparing of the gallium nitride wafer includes using the recycle wafer again as the gallium nitride wafer.

6. A processed wafer including a semiconductor chip formed with a semiconductor element, the processed wafer comprising:
   a gallium nitride wafer;
   an epitaxial film disposed on a surface of the gallium nitride wafer; and
   a mark disposed inside of at least one of the gallium nitride wafer and the epitaxial film, the mark being a region with nitrogen atom deficiency,
   wherein
   the mark includes at least one of a wafer mark disposed inside of the gallium nitride wafer or a chip mark disposed inside the epitaxial film.

7. A semiconductor chip comprising:
   a chip constituent substrate made of gallium nitride, the chip constituent substrate having a first surface and a second surface opposite to the first surface, and including a semiconductor element; and
   a mark disposed inside the chip constituent substrate, the mark being a region with nitrogen atom deficiency,
   wherein
   the mark is a chip mark.

8. The semiconductor chip according to claim 6, wherein:
   the wafer mark is disposed inside of the gallium nitride wafer at a position separated from the surface of the gallium nitride wafer.

9. The processed wafer according to claim 8, wherein
   the wafer mark disposed inside of the gallium nitride wafer has a flat shape extending parallel to the surface of the gallium nitride wafer.

10. The semiconductor chip according to claim 6, wherein:
    the chip mark is disposed inside the epitaxial film at a position separated from the surface of the gallium nitride wafer.

11. The processed wafer according to claim 10, wherein
    the chip mark disposed inside the epitaxial film has a flat shape extending parallel to the surface of the gallium nitride wafer.

12. The semiconductor chip according to claim 7, wherein
    the chip constituent substrate has a first layer adjacent to the first surface and a second layer adjacent to the second surface, and includes a semiconductor element at least in the first layer, and
    the mark is disposed inside the second layer of the chip constituent substrate at a position separate from the second surface and an interface between the first layer and the second layer.

13. The semiconductor chip according to claim 10, wherein
    the chip mark has a flat shape extending parallel to the second surface.

* * * * *